US012571935B2

(12) United States Patent
Krishnan et al.

(10) Patent No.: US 12,571,935 B2
(45) Date of Patent: Mar. 10, 2026

(54) IN-LINE NMR SENSOR FOR ANALYZING DRILL CUTTINGS AFTER TREATMENT

(71) Applicant: Baker Hughes Oilfield Operations LLC, Houston, TX (US)

(72) Inventors: Aswath Krishnan, Spring, TX (US);
Reza Ettehadi Osgouei, Houston, TX
(US); Charles A. Thompson, Jr.,
Kingwood, TX (US)

(73) Assignee: Baker Hughes Oilfield Opertaions LLC, Houston, TX (US)

( * ) Notice: Subject to any disclaimer, the term of this
patent is extended or adjusted under 35
U.S.C. 154(b) by 155 days.

(21) Appl. No.: 18/508,140

(22) Filed: Nov. 13, 2023

(65) Prior Publication Data

US 2025/0155601 A1 May 15, 2025

(51) Int. Cl.
*G01V 3/32* (2006.01)
*G01N 24/08* (2006.01)
*G01R 33/38* (2006.01)

(52) U.S. Cl.
CPC ............. *G01V 3/32* (2013.01); *G01N 24/081*
(2013.01); *G01N 24/082* (2013.01); *G01R*
*33/3808* (2013.01)

(58) Field of Classification Search
CPC ...... G01V 3/32; G01N 24/082; G01N 24/081;
G01R 33/3808
See application file for complete search history.

(56) References Cited

U.S. PATENT DOCUMENTS

| 10,436,865 B2 | 10/2019 | Washburn |
| 10,488,352 B2 | 11/2019 | Chen et al. |
| | (Continued) | |

FOREIGN PATENT DOCUMENTS

| CN | 204804835 U | 11/2015 |
| CN | 105987925 B | 5/2018 |
| CN | 109709130 B | 2/2022 |

OTHER PUBLICATIONS

Romero-Sarmiento; "A quick analytical approach to estimate both free versus sorbed hydrocarbon contents in liquid-rich source rocks"; The American Association of Petroleum Geologists; AAPG Bulletin, V. 103, No. 9; Sep. 2019; pp. 2031-2043.

(Continued)

*Primary Examiner* — Rishi R Patel
(74) *Attorney, Agent, or Firm* — Baker Hughes Company

(57) ABSTRACT

An apparatus for processing cuttings from drilling a borehole in a geologic formation includes: a cuttings processing system having a cuttings processing device to remove oil from the cuttings that includes an adjustable operational parameter and an actuator or a device controller for adjusting the adjustable operational parameter; an in-line nuclear magnetic resonance (NMR) instrument comprising a conduit coupled to an output of the cuttings processing system or the processing device and containing the discharged cuttings and providing an NMR output signal related to an amount of oil measured by the in-line NMR instrument; and a controller coupled to the in-line NMR instrument, the controller having a controller output coupled to the processing device and providing a control signal to adjust the adjustable operational parameter in accordance with an algorithm that uses the NMR output signal as input to reduce the amount of oil retained by the cuttings.

22 Claims, 5 Drawing Sheets

(56) References Cited

U.S. PATENT DOCUMENTS

| | | | |
|---|---|---|---|
| 2005/0242003 A1* | 11/2005 | Scott | B01D 33/0315 |
| | | | 210/388 |
| 2006/0272812 A1 | 12/2006 | Yu et al. | |
| 2007/0221410 A1* | 9/2007 | Butler | E21B 21/065 |
| | | | 175/66 |
| 2016/0108687 A1* | 4/2016 | Rapoport | G01V 3/38 |
| | | | 702/9 |
| 2017/0314352 A1* | 11/2017 | Anderson | B04B 1/2016 |
| 2018/0003654 A1 | 1/2018 | Chen et al. | |
| 2018/0239051 A1 | 8/2018 | Appel et al. | |
| 2021/0132243 A1 | 5/2021 | Ye et al. | |
| 2021/0319257 A1 | 10/2021 | Francois et al. | |
| 2022/0381714 A1* | 12/2022 | Mitchell | E21B 21/01 |

OTHER PUBLICATIONS

Notification of Transmittal of the International Search Report and Written Opinion; PCT/US2024/055085; Korean Intellectual Property Office; mailed Feb. 25, 2025; 10 pages.

Singh et al., "Automated real-time formation evaluation from cuttings and drilling data analysis: State of the art"; Advances in Geo-Energy Research; vol. 8, No. 1, p. 19-36, 2023.

* cited by examiner

14

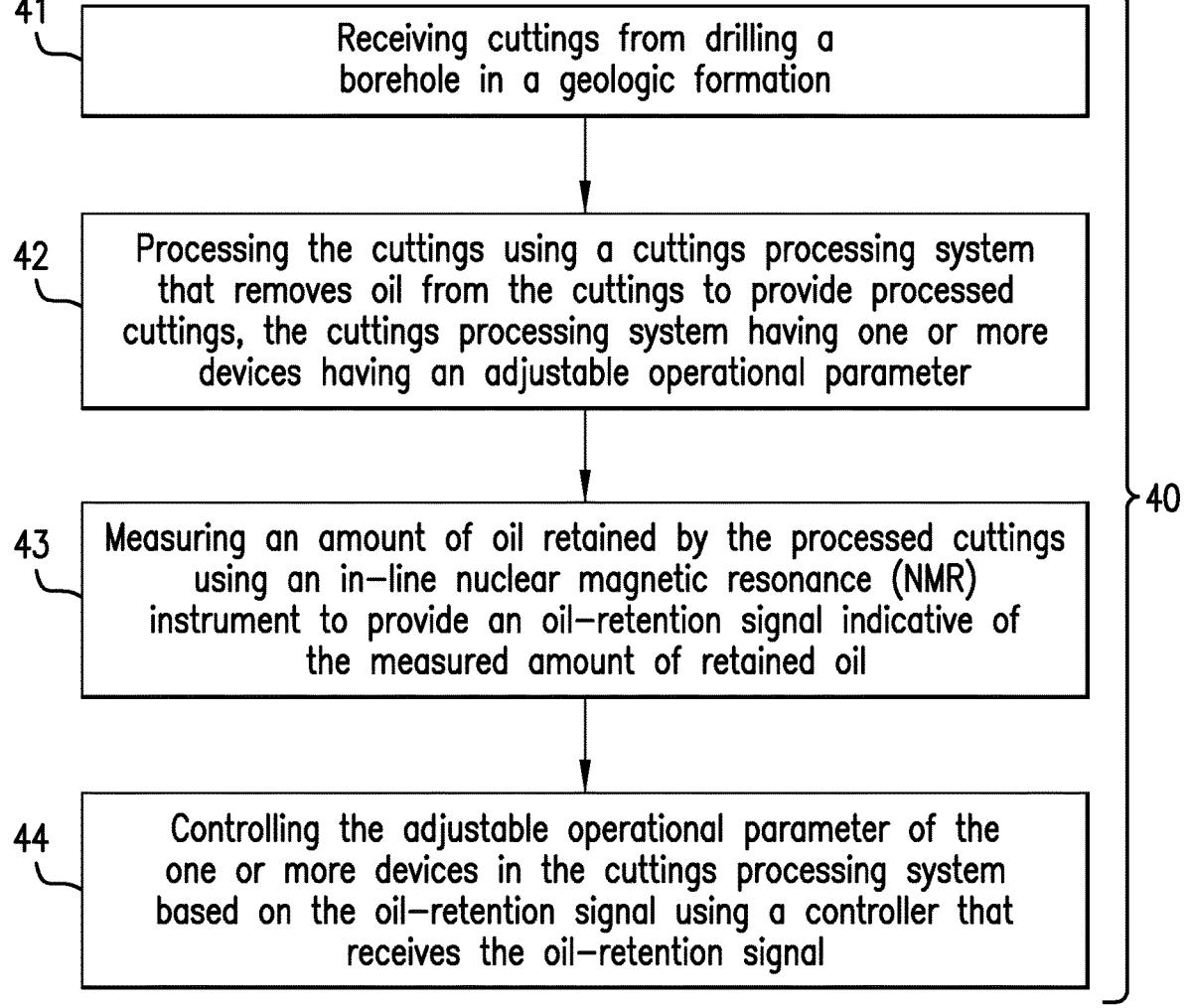

41  Receiving cuttings from drilling a
    borehole in a geologic formation

42  Processing the cuttings using a cuttings processing system
    that removes oil from the cuttings to provide processed
    cuttings, the cuttings processing system having one or more
    devices having an adjustable operational parameter 43  Measuring an amount of oil retained by the processed cuttings
    using an in-line nuclear magnetic resonance (NMR)
    instrument to provide an oil-retention signal indicative of
    the measured amount of retained oil 44  Controlling the adjustable operational parameter of the
    one or more devices in the cuttings processing system
    based on the oil-retention signal using a controller that
    receives the oil-retention signal

IN-LINE NMR SENSOR FOR ANALYZING DRILL CUTTINGS AFTER TREATMENT

BACKGROUND

This disclosure relates generally to oilfield equipment for evaluating cuttings in drilling fluid also referred to as drilling mud and more particularly to nuclear magnetic resonance instruments and methods for estimating an amount of oil retained on the cuttings.

Drilling boreholes in earth formations for the exploration and production of hydrocarbons causes rock cuttings to be produced in the boreholes due to drill bit to formation rock interactions, which disintegrates or cuts formation rock. The rock cuttings are entrained in drilling fluid and are extracted as the drilling fluid exits the boreholes during the drilling process. After the cuttings undergo various processes at the surface, they must be disposed of in an environmentally acceptable manner.

Regulatory standards are established that require a maximum amount of oil that can be retained on the cuttings when the cuttings are disposed. Current practice is to manually measure the amount of retained oil by heating or burning a sample of the cuttings in a retort either at the drilling site or offsite at a laboratory. This manual process can take a considerable amount of time and may result in economic inefficiencies due to the time lag. Hence, sensors that do not require heating a sample of cuttings and the time to do so to estimate oil retention would be well received in the hydrocarbon exploration and recovery industry.

BRIEF SUMMARY

Disclosed is an apparatus for processing cuttings from drilling a borehole in a geologic formation. The apparatus includes a cuttings processing system comprising a cuttings processing device configured to remove oil from the cuttings, the cuttings processing device comprising an adjustable operational parameter related to operation of the cuttings processing device and at least one of an actuator or a device controller for adjusting the adjustable operational parameter. The apparatus also includes an in-line nuclear magnetic resonance (NMR) instrument comprising a conduit coupled to an output of at least one of the cuttings processing system or the processing device and containing the discharged cuttings, the in-line NMR instrument comprising an output providing an NMR output signal related to an amount of oil measured by the in-line NMR instrument. The apparatus further includes a controller coupled to the output of the in-line NMR instrument, the controller having a controller output coupled to the processing device and providing a control signal to adjust the adjustable operational parameter in accordance with an algorithm that uses the NMR output signal as input to reduce the amount of oil retained by the cuttings.

Also disclosed is a method for processing cuttings from drilling a borehole in a geologic formation. The method includes processing the cuttings using a cuttings processing system configured to remove oil from the cuttings and comprising a cuttings processing device having an adjustable operational parameter related to operation of the cuttings processing device. The method also includes measuring an amount of oil retained by the cuttings discharged by the cuttings processing system using an in-line nuclear magnetic resonance (NMR) instrument comprising a conduit coupled to an output of at least one of the cuttings processing system or the processing device and containing the discharged cuttings, the NMR instrument providing an NMR output signal related to the amount of oil measured by the in-line NMR instrument. The method further includes adjusting the adjustable operational parameter using a controller in accordance with an algorithm that uses the NMR output signal as input to reduce the amount of oil retained by the cuttings.

BRIEF DESCRIPTION OF THE DRAWINGS

The following descriptions should not be considered limiting in any way. With reference to the accompanying drawings, like elements are numbered alike:

FIG. 4 is a flowchart representation of a method for discharging processed cuttings.

DETAILED DESCRIPTION

A detailed description of one or more embodiments of the disclosed apparatus and method presented herein by way of exemplification and not limitation with reference to the figures. In the figures, arrows representing conveyance of a fluid or a flowable or conveyable solid may include representing pipes or structures for directing a flow or conveyance and may be referred to as "a conduit" herein. These arrows may also represent any associated components such as valves, pumps, and fittings and the like needed for flowing and/or conveying the fluid. Similarly, arrows used to illustrate signal communication may represent a communication medium such as a conductor for electrical signals and/or a fiber optic for optical signals. These arrows may also represent any associated components such as connectors, splices, and signal devices and the like needed for signal communication between components. While not explicitly discussed or illustrated, the various components of the disclosed apparatus requiring power inherently include a power supply or connection to a power source.

Disclosed are apparatuses and methods for discharging cuttings obtained from drilling a borehole. Drilling fluid entrained with the cuttings are first processed by one or more processing devices, each device having one or more adjustable processing parameters. The processed cuttings then flow through an inline nuclear magnetic resonance (NMR) instrument to provide an NMR signal indicative of an amount of oil and/or water retained by the processed cuttings. Hence, the NMR instrument is used to measure an amount of oil and/or water retained by the processed cuttings. The measured amount of oil retention is compared to a threshold value or a setpoint. The threshold value may be a regulatory value for discharging the cuttings. If the measured oil retention value is less than or equal to the threshold value, then the cuttings are discharged to a disposal facility. If the measured oil retention value is greater than the threshold value, then one or more of the processing parameters of the one or more devices are adjusted either manually or automatically to lower the measured oil retention value.

Figure 1A:
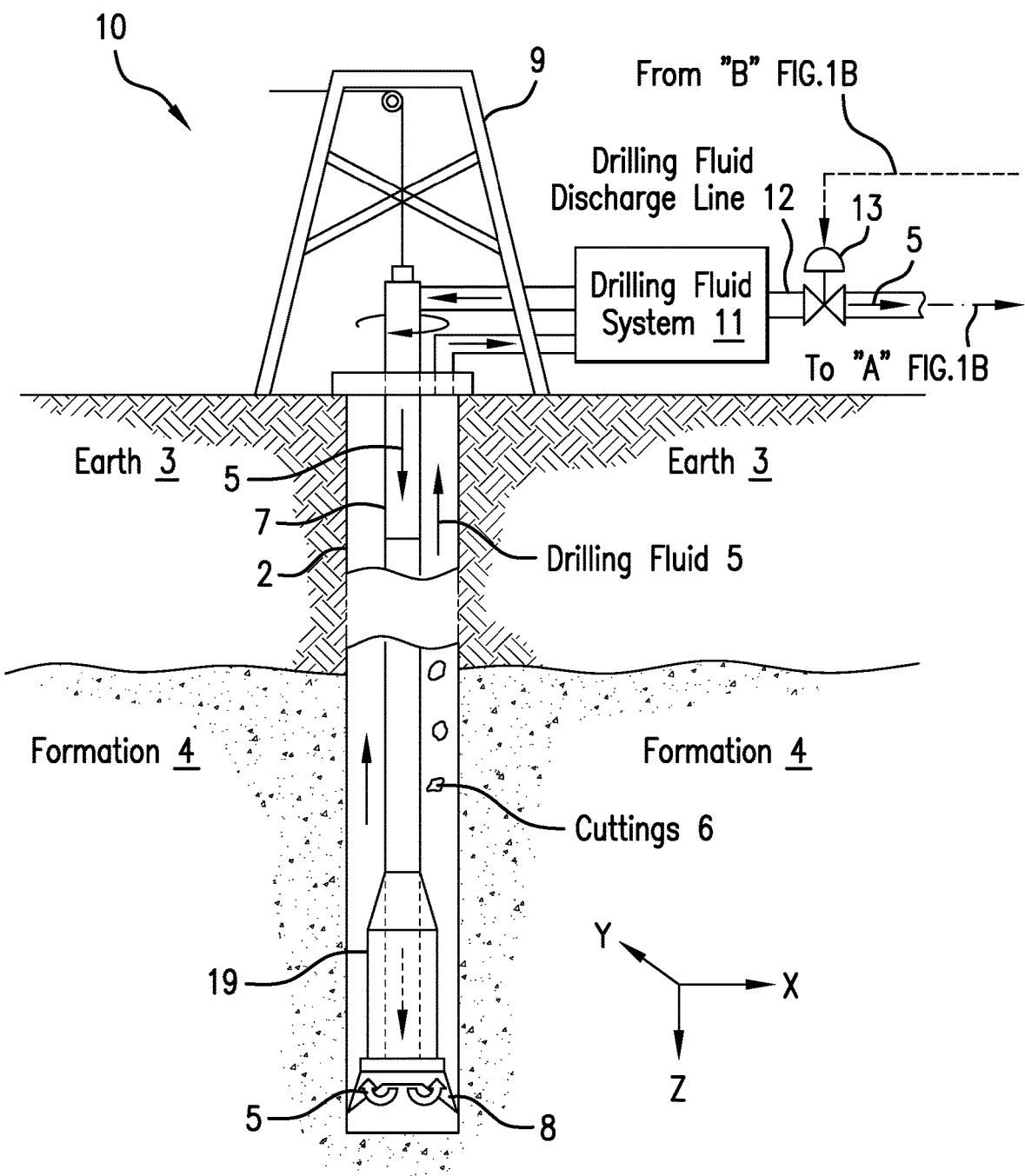
FIGS. 1A and 1B, collectively referred to as FIG. 1, illustrate a drilling system for drilling a subsurface borehole and a system for processing cuttings obtained from drilling the borehole.
Figure 1B:
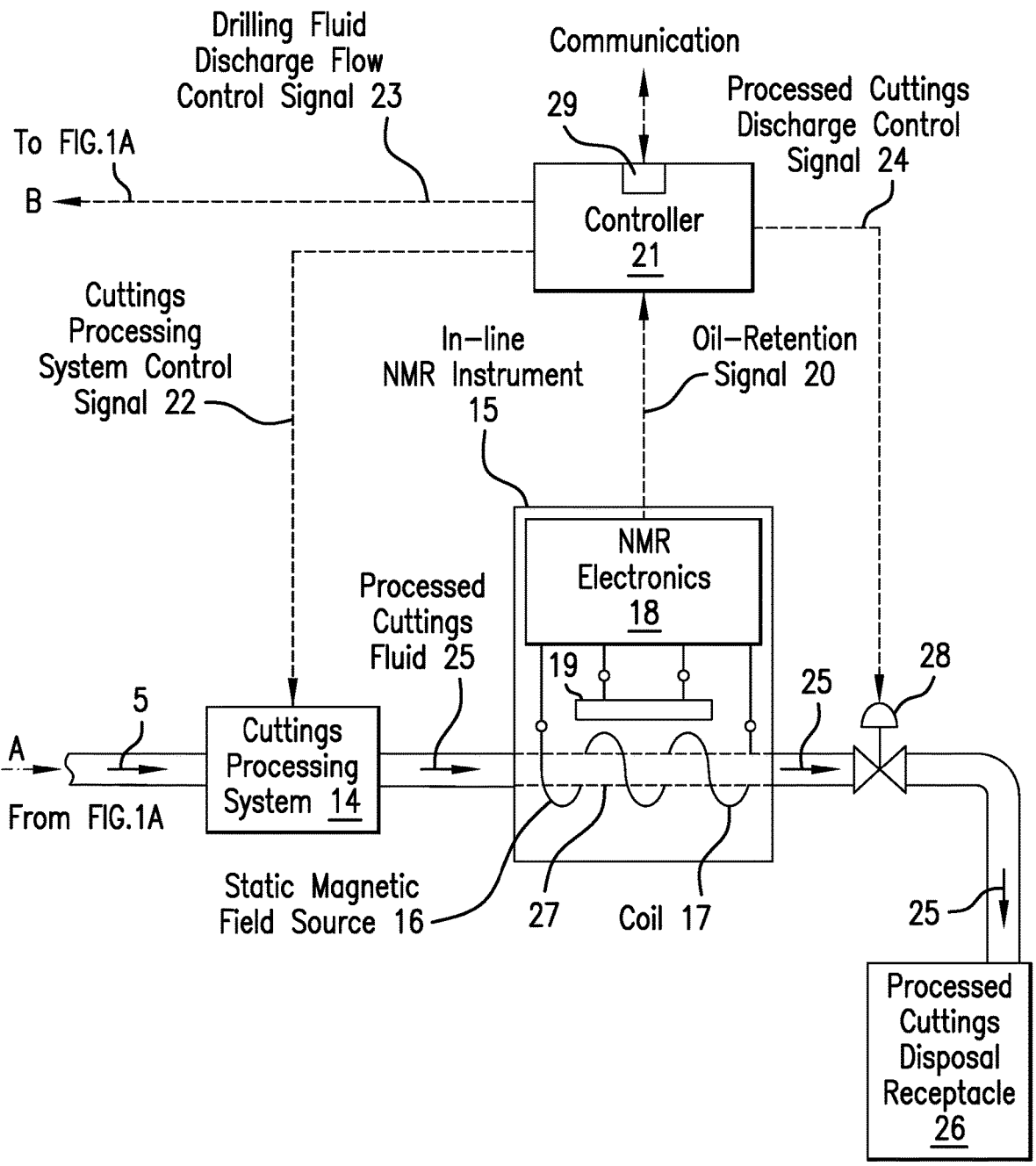

FIG. 1 illustrates a non-limiting embodiment of a drilling system 10. The drilling system 10 includes a drill rig 9. The drill rig 9 is configured to output energy to a drill bit 8 for drilling a borehole 2 in the earth 3 having a formation 4 that has a reservoir of hydrocarbons. For example, the drill rig 9 may be configured to rotate a drill tubular 7, such as a series of coupled drill pipes, which in turn rotates the drill bit 8 to drill the borehole 2. The drill bit 8 is disposed at a distal end of the drill tubular 7 and may be included in a bottom-hole assembly 19, which may include sensors and/or directional drilling components. Alternatively, in a coiled-tubing embodiment the drill rig 9 may be configured to pump drilling fluid 5 (also referred to as drilling mud) to a downhole mud motor (not shown) that turns the drill bit 8. In one or more embodiments, the drill rig 9 pumps the drilling fluid 5 through the drill tubular 7 to the drill bit 8 to lubricate the drill bit 8 and flush cuttings 6 from the borehole 2.

A drilling fluid system 11 is disposed at the surface of the earth 3. The drilling fluid system 11 pumps the drilling fluid 5 through the drill tubular 7 and receives the drilling fluid 5 entrained with the cuttings 6. The drilling fluid system 11 may also be configured to add additives to the drilling fluid 5 to obtain certain desired properties for improved drilling performance.

A drilling fluid discharge line 12 is coupled to the drilling fluid system 11 to remove the drilling fluid 5 when it is no longer needed. A fluid discharge control device 13 such as a valve may be coupled to the drilling fluid discharge line 12 to isolate the discharge or control a flow rate of the discharge.

A cuttings processing system 14 is configured to receive the drilling fluid 5 entrained with the cuttings 6 discharged from the drilling fluid system 11. The cuttings processing system 14 includes one or more processing devices that process the drilling fluid 5 entrained with the cuttings 6 from the borehole 2 to minimize an amount of the drilling fluid 5 and the cuttings 6 to be disposed. The one or more processing devices (discussed further below) have one or more adjustable parameters that can be manually adjusted or automatically adjusted to improve processing performance. After processing, the cuttings processing system 14 provides processed cuttings 25. The processed cuttings 25 may not be entrained in enough fluid to flow and thus may be conveyed by a screw conveyer in one or more embodiments.

The processed cuttings fluid 25 flows or is conveyed through an in-line NMR instrument 15 that is configured to measure an amount of oil retained by the cuttings in the processed cuttings 25. In one or more embodiments, the processed cuttings 25 flows or is conveyed through a conduit 27 in the NMR instrument 15. The NMR instrument 15 includes a static magnetic field source 16 such as a coil 17. Alternatively or in addition, the static magnetic field source 16 may include a permanent magnet. The NMR instrument 15 also includes a radio-frequency (RF) antenna 19 configured to emit an RF signal pulse into the processed cuttings 25 causing atoms to tilt away from alignment with the static magnetic field. After the RF pulse, the atoms process back to alignment with the static magnetic field and emit an NMR signal that correlates to the material composition in the processed cuttings 25. The emitted NMR signal is received by the RF antenna 19 or another antenna. NMR electronics 18 operate the NMR instrument 15 to include supplying an electric current to the coil 17, transmitting the RF pulse through the antenna 19, receiving the NMR signal in response to the transmitted RF signal, processing the NMR signal to determine a longitudinal relaxation time constant $(T_1)$ and/or a transverse relaxation time constant $(T_2)$, and outputting an oil-retention signal 20 that correlates to an amount on oil retained by the processed cuttings 25 based on the NMR signal. Correlation the NMR signal to the amount of oil retention can be determined by analysis, experience, and/or testing involving reference standards having known characteristics. In that NMR instruments and implementation of such are known in the art, the in-line NMR instrument 15 is not discussed in further detail.

With respect to operation of the in-line NMR instrument 15, $T_1$ relaxation is the time it takes for the magnetic moments of the nuclei to come back to equilibrium with the environment, i.e., return to alignment along the applied magnetic field. $T_2$ is the time it takes the magnetic moments of the nuclei to come to equilibrium among themselves. When the system is initially excited, all the nuclei are precessing in unison. As time progresses, the nuclei interact with each other and their environment, such that they lose synchronicity. Eventually, at long enough time, all order between the precessing magnetic moments is lost and they will be in a completely disordered state. A diffusion measurement is used to measure the diffusion coefficients of the constituents present in the sample and can be used to determine fluids present. The hydrogen isotope (1H) is present in oil, a hydrocarbon, and has high NMR sensitivity. Accordingly, the NMR signal is generally proportional to the amount of hydrogen present on the processed cuttings 25. Hence, the NMR signal level for cuttings retaining a certain amount of oil will be greater than the NMR signal level for cuttings retaining a lesser amount of oil.

From the in-line NMR instrument 15, the processed cuttings 25 flows or is conveyed through a processed cuttings control device 28, which can be a valve in a non-limiting embodiment or, alternatively, switch gear for turning off a screw conveyer in embodiments having the screw conveyor. The processed cuttings control device 28 can isolate a discharge of the processed cuttings fluid 25 or control a flow rate of the discharge. The processed cuttings 25 flows or is conveyed to a processed cuttings discharge receptacle 26.

As noted above, the in-line NMR instrument 15 outputs the oil-retention signal 20. The oil-retention signal 20 is provided to a controller 21. The controller 21 is configured to output a cuttings processing system control signal 22 to the cuttings processing system 14 to reduce an amount of oil retained on the processed cuttings 25. The cuttings processing system control signal 22 is a signal that can control the one or more adjustable parameters of the one or more processing devices in the cuttings processing system 14 based on the measured amount of oil retention in the processed cuttings 25. In one or more embodiments, if the amount of oil retention exceeds an expected value, then the cuttings processing system control signal 22 can adjust one or more of the adjustable parameters in order to improve operation of the cuttings processing system 14 with the expectation of lowering the amount of oil retention. In one or more embodiments, the oil-retention signal 20 is a feedback signal to the controller 21 in order for the controller 21 to maintain an oil retention setpoint. The oil retention setpoint may be an optimized setpoint determined by analysis and/or operational experience. The one or more adjustable parameters are adjusted in accordance with an algorithm. The algorithm may implement traditional analog control algorithms such as proportional, integral, and/or derivative control or the algorithm may implement model-based control algorithms, neural network algorithms, machine-learning algorithms, or artificial intelligence-based algorithms as known in the art to provide control functions. Operational models of the cuttings processing system 14 can be developed by analysis and/or testing of each individual processing device using reference standards having known characteristics to improve operation and/or efficiency in removing oil from the cuttings 5.

The controller 21 can also emit a drilling fluid discharge flow control signal 23 to the fluid discharge control device 13 to either close the control device 13 or modulate the control device 13 to maintain a desired flow rate. For example, if the oil-retention signal 20 indicates a level of oil retention that exceeds a regulatory limit, then the controller 21 can cause the fluid discharge control device 13 to close thereby preventing a discharge over the regulatory limit. To perform this function, the controller 21 can have a bistable circuit or bistable algorithm that implements a bistable function. A threshold value such as the regulatory limit may be input into the controller 21 using an input/output (I/O) port 29. The I/O port 29 may also be connected to a computer processing system (not shown), either local or remote, for monitoring the results of the cuttings processing system 14. The I/O port 29 may also be used to input a setpoint or a control algorithm into the controller 21.

The controller 21 can also emit a processed cuttings discharge control signal 24 to the processed cuttings fluid control device 28 for control similar to the control of the fluid discharge control device 13.

Figure 2:
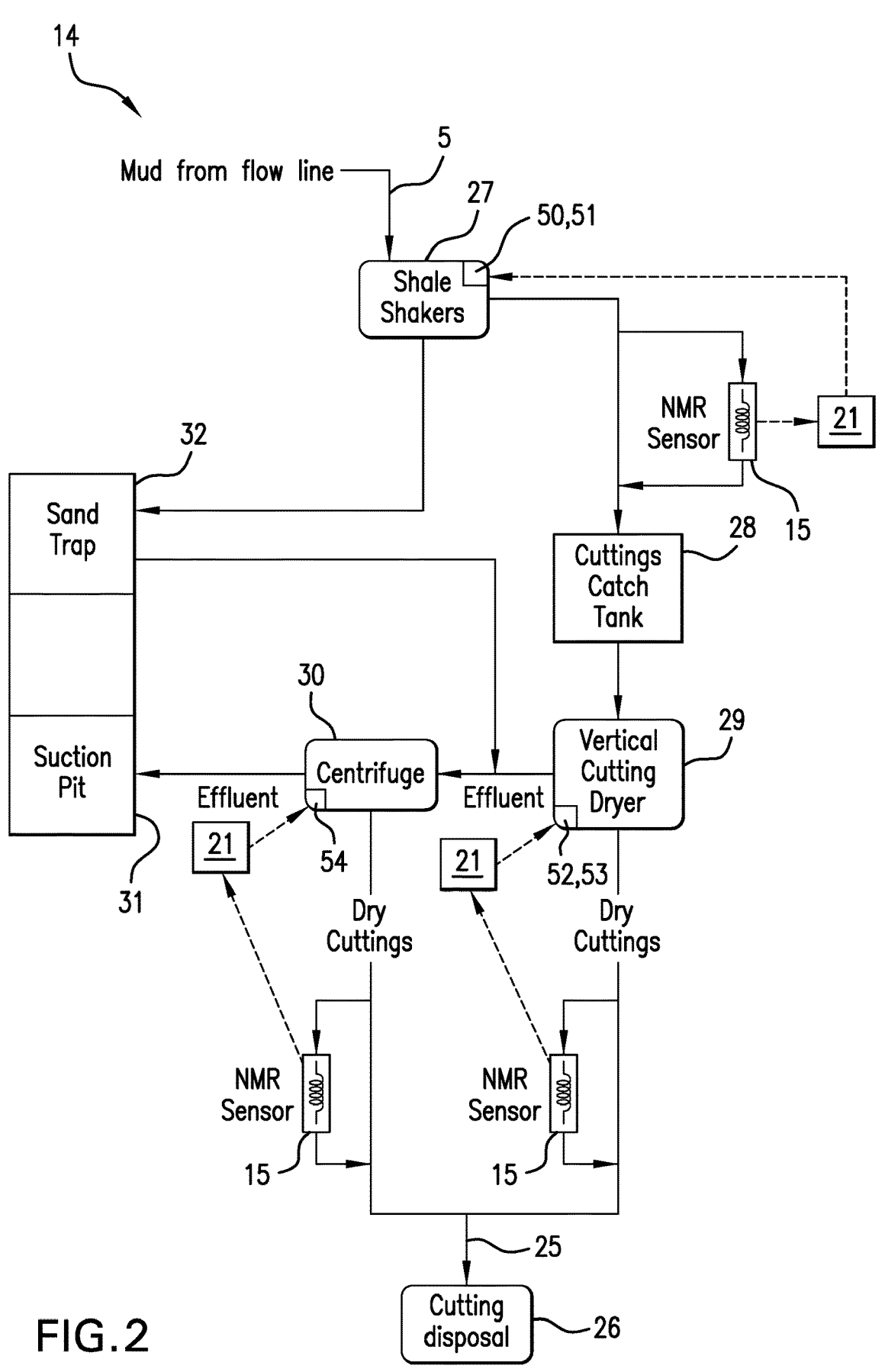
FIG. 2 depicts aspects of an embodiment of a cuttings processing system.

FIG. 2 illustrates a flow diagram for an embodiment of the cuttings processing system 14. In this embodiment, three separate in-line NMR instruments 15 are used in sample lines at various locations downstream of processing devices to measure oil retention and thus the efficiency of the corresponding processing devices. Each of these processing devices has an adjustable parameter that can be controlled by the cuttings processing control signal 22 from the controller 21. A sample pump (not shown) may be used to pump a sample through each sample line.

With reference to FIG. 2, the drilling fluid 5 form the drilling fluid system 11 is provided to a shale shaker 27. Larger cuttings from the shale shaker 27 are provided to a cuttings catch tank 28 while effluent from the shale shaker 27 is directed to a sand trap 32. The sand trap 32 is the initial point of fluid return into the "active" system after the shale shaker. The active system includes all equalized surface tanks and the drilling fluid circulating down and back up the borehole in a circular "active" fluid flow path (see the drilling fluid system 11 in FIG. 1A). The "sand trap" pit (also known as a settling pit) is a fluid pit/tank that has no mechanical agitation and is connected to the next inline pit via an equalizer valve. The lack of agitation encourages any larger, heavy particles to settle to the bottom prior to flowing down the line to the next tank. This includes drilled cuttings not removed by the shaker. Tanks further in the system will have mechanical agitation to prevent commercial solids from settling out. The cuttings catch tank 28 acts as a "buffer" to catch the continuous feed of cuttings, allowing the Vertical Cuttings Dryer to process the drilled cuttings in "batches". For some VCD's, this allows them to be more efficient. Note that not all setups are like this, some have a direct feed with the Dryer running in continuous mode, not batch. The shale shaker 27 is a first phase of a solids control system for the drill rig 9 and is used to remove large solids (cuttings) from the drilling fluid ("mud"). In one or more embodiments, the shale shaker 27 includes a hopper, a feeder, a screen basket, a basket angling mechanism, and a vibrator as known in the art. As disclosed herein, a remotely controlled actuator 50 is used to adjust the basket angle to accommodate various flow rates of the drilling fluid 5 and to maximize the use of the shaker bed. The actuator 50 is controlled by the controller 21 via the cuttings processing control signal 22. Additionally as disclosed herein, the shale shaker 27 may include shaker variable speed controller 51 configured to vary shaker speeds. Optimized basket angles for various flow rates and shaker bed efficiency can be determined by analysis, using past experience, and/or tests using various reference flow rates and shaker bed efficiencies. Optimized shaker speeds can be determined by analysis, using past experience, and/or tests reference cuttings having various known characteristics.

The larger cuttings from the cuttings catch tank 28 are provided to a vertical cuttings dryer 29 where the larger cuttings are dried. Dried larger cuttings from the vertical cuttings dryer 29 are disposed of at the processed cuttings fluid disposal receptacle 26. The vertical cuttings dryer 29 incorporates a high-speed vertical centrifuge and centrifuge screen that maximizes liquid-solid separation in large-volume processing as known in the art. As disclosed herein, the vertical cuttings dryer 29 may include a first variable speed controller 52 that is remotely controlled by the controller 21 via the cuttings processing control signal 22. Additionally as disclosed herein, the vertical cuttings dryer 29 may include a second variable speed controller 53 to vary the speed of a screw conveyor conveying the large cuttings to the vertical cuttings dryer 29. The second variable speed controller is remotely controlled by the controller 21 via the cuttings processing control signal 22. Optimized centrifuge speeds and cuttings feed speeds can be determined by analysis and/or tests using various reference centrifuge speeds and cuttings feed speeds for reference cuttings having various known characteristics.

Effluent from the vertical cuttings dryer 29 and fluid from the sand trap 32 is provided to a centrifuge 30. Dry cuttings from the centrifuge 30 are disposed of at the processed cuttings fluid disposal receptacle 26. Effluent from the centrifuge 30 is sent to a suction pit 31. As noted above, the active system includes all equalized surface tanks and the fluid circulating down and back up the borehole in a circular "active" fluid flow path. The suction pit 31 is the last pit/tank in the surface "active" fluid system. The drilling fluid is drawn from the suction pit via the mud/fluid pumps and circulated down the drillstring and backup the borehole. In one or more embodiments, the centrifuge 30 uses centrifugal force and a flighted scroll to effect separation as known in the art. As disclosed herein, the centrifuge 30 may include a centrifuge variable speed controller 53 that is remotely controlled by the controller 21 via the cuttings processing control signal 22 to remotely vary the speed of the centrifuge 30. Optimized speed for the centrifuge 30 can be determined by analysis and/or tests using various speeds for reference cuttings having different known characteristics.

Figure 3:
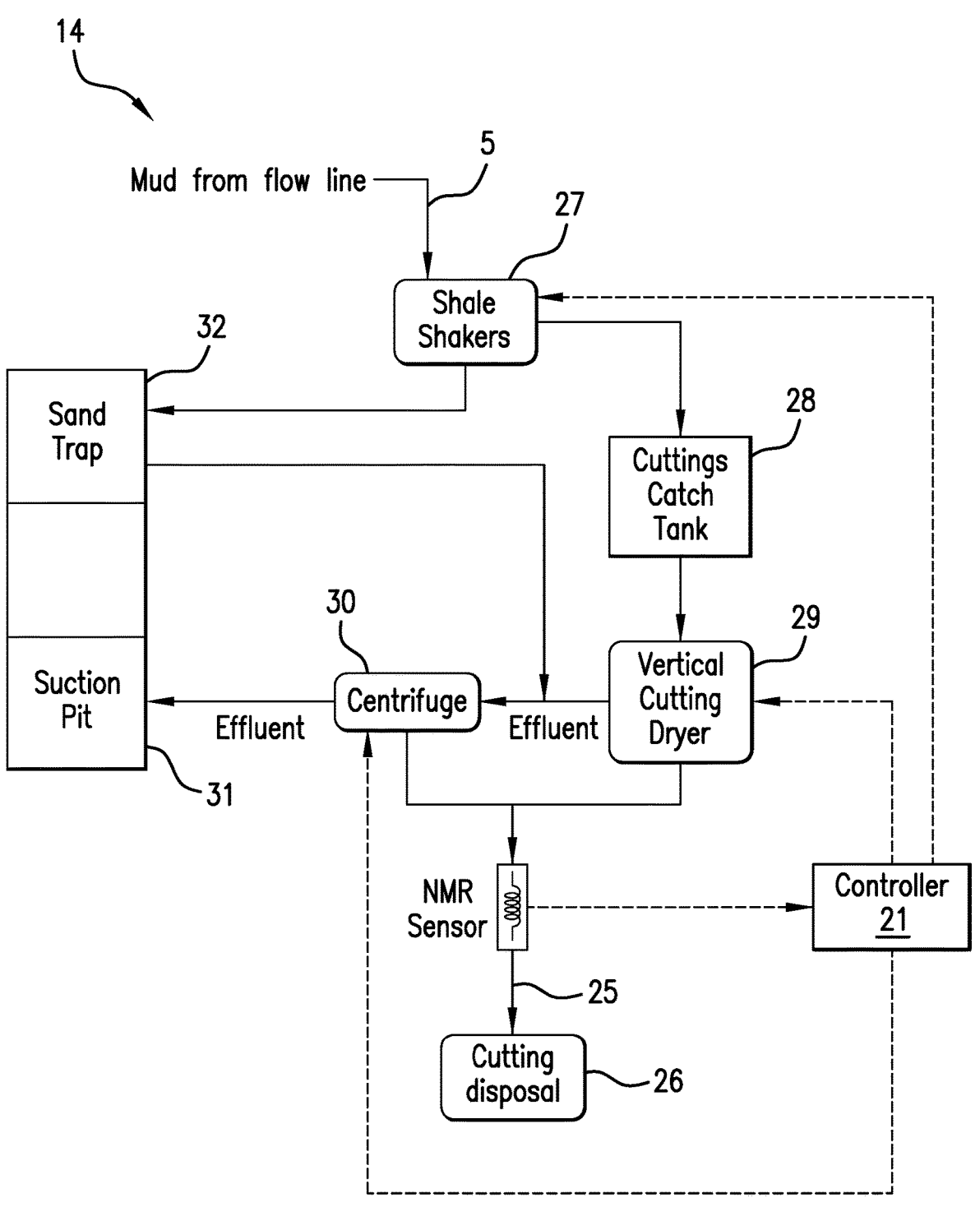
FIG. 3 depicts aspects of another embodiment of the cuttings processing system.

FIG. 3 illustrates a flow chart for another embodiment of the cuttings processing system 14. In the embodiment of FIG. 3, one in-line NMR instrument 15 is used to measure oil retention in the processed cuttings 25. One or more controllers 21 may be used to control the shale shaker 27, the vertical cuttings dryer 29, and the centrifuge 30 based on the amount measured oil retention.

FIG. 4 is a flow chart representation for a method 40 for processing cuttings from drilling a borehole in a geologic formation. Block 41 calls for receiving cuttings from drilling a borehole in a geologic formation.

Block 42 calls for processing the cuttings using a cuttings processing system that removes oil from the cuttings to provide processed cuttings, the cuttings processing system having one or more devices having an adjustable operational parameter. Non-liming embodiments of the one or more devices include a shale shaker, a vertical dryer, a centrifuge, and a conveyance device having an adjustable speed for conveying the cuttings through the processing device or devices. Non-limiting embodiment of the conveyance device include a conduit with a flow control valve and a screw conveyor having a variable speed control.

Block 43 calls for measuring an amount of oil retained by the processed cuttings using an in-line nuclear magnetic resonance (NMR) instrument to provide an oil-retention signal indicative of the measured amount of retained oil. The term "in-line" relates to the NMR instrument being in line with a main flow line of the cuttings or in line with a sample line that withdraws a sample of the cuttings from the main sample line. Block 43 may also include measuring an amount of water retained by the cuttings using the in-line nuclear magnetic resonance (NMR) instrument to provide a water-retention signal indicative of the measured amount of retained water.

Block 44 calls for controlling the adjustable operational parameter of the one of more devices in the cuttings processing system based on the oil-retention signal using a controller that receives the oil-retention signal. Controlling the adjustable parameter can improve removal of oil from the cuttings and/or improve efficiency of the cuttings processing by removing the oil in a shorter period of time or with less energy. Both the measuring using the in-line NMR instrument and the controlling using the controller can be performed in real time with resulting improvement of oil removal and efficiency (e.g., oil removal amount/time). Block 44 may also include controlling the adjustable operational parameter of the one of more devices in the cuttings processing system based on the water-retention signal using the controller that receives the water-retention signal. Hence in one or more embodiments, both the measured amount of oil and the measured amount of water may be used to control the adjustable operational parameter of the one of more devices in the cuttings processing system.

The apparatuses and methods disclosed herein provide several advantages. One advantage is that the processing of cuttings to include adjustment of operational parameters can be performed in real time and thus improve efficiency and lower cost. Another advantage is that by automatically adjusting the operational parameters, fewer workers may be needed for the cuttings processing task. Yet another advantage is that there is lower likelihood of violating any regulatory limits in the discharge of cuttings.

In support of the teachings herein, various analysis components may be used, including a digital and/or an analog system. For example, the NMR electronics 18, the controllers 21, 51, 52, 53 and 54, and the actuator 50 may include digital and/or analog systems. The system may have components such as a processor, storage media, memory, input, output, communications link (wired, wireless, optical or other), user interfaces (e.g., a display or printer), software programs, signal processors (digital or analog) and other such components (such as resistors, capacitors, inductors and others) to provide for operation and analyses of the apparatus and methods disclosed herein in any of several manners well-appreciated in the art. Digital and/or analog processors may include a mathematics module or software for performing mathematical operations and analytical operations discussed in the disclosure herein. It is considered that these teachings may be, but need not be, implemented in conjunction with a set of computer executable instructions stored on a non-transitory computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

Further, various other components may be included and called upon for providing for aspects of the teachings herein. For example, a power supply, magnet, electromagnet, sensor, electrode, transmitter, receiver, transceiver, antenna, controller, optical unit or components, electrical unit or electromechanical unit may be included in support of the various aspects discussed herein or in support of other functions beyond this disclosure.

Set Forth Below are Some Embodiments of the Foregoing Disclosure

Embodiment 1: An apparatus for processing cuttings from drilling a borehole in a geologic formation, the apparatus including a cuttings processing system comprising a cuttings processing device configured to remove oil from the cuttings, the cuttings processing device comprising an adjustable operational parameter related to operation of the cuttings processing device and at least one of an actuator or a device controller for adjusting the adjustable operational parameter, an in-line nuclear magnetic resonance (NMR) instrument comprising a conduit coupled to an output of at least one of the cuttings processing system or the processing device and containing the discharged cuttings, the in-line NMR instrument comprising an output providing an NMR output signal related to an amount of oil measured by the in-line NMR instrument, and a controller coupled to the output of the in-line NMR instrument, the controller having a controller output coupled to the processing device and providing a control signal to adjust the adjustable operational parameter in accordance with an algorithm that uses the NMR output signal as input to reduce the amount of oil retained by the cuttings.

Embodiment 2: The apparatus as in any prior embodiment, wherein the cuttings in the conduit flow continuously through the conduit while being sensed by the NMR instrument.

Embodiment 3: The apparatus as in any prior embodiment, wherein the in-line NMR instrument further comprises a magnetic field source creating a static magnetic field within the conduit, an antenna transmitting a radio-frequency (RF) signal into the conduit and receiving an NMR signal in response to the transmitted signal, and electronics coupled to the antenna and having a processor processing the NMR signal to measure the amount of oil retained by the discharged cuttings, the electronics having an output providing the NMR output signal.

Embodiment 4: The apparatus as in any prior embodiment, wherein the cuttings processing system comprises a plurality of cuttings processing devices and the in-line NMR instrument comprises a plurality of in-line NMR instruments with at least one of the in-line NMR instruments in the plurality being disposed at least one of (i) immediately downstream of each of the cuttings processing devices or (ii) immediately downstream of each of the cuttings processing devices and upstream of each of the cuttings processing devices.

Embodiment 5: The apparatus as in any prior embodiment, where the cuttings processing system comprises a shale shaker, a vertical cuttings dryer, and a centrifuge, and the in-line NMR instrument comprises: at least one of (i) a first in-line NMR instrument disposed immediately downstream of the shale shaker or (ii) a first in-line NMR instrument disposed immediately downstream of the shale shaker and a second in-line NMR instrument disposed upstream of the shale shaker; at least one of (iii) a third in-line NMR instrument disposed immediately downstream of the vertical cuttings dryer or (iv) a third in-line NMR instrument disposed immediately downstream of the vertical cuttings dryer and a fourth in-line NMR instrument disposed upstream of the vertical cuttings dryer; and at least one of (v) a fifth in-line NMR instrument disposed immediately downstream of the centrifuge or (vi) a fifth in-line NMR instrument disposed immediately downstream of the centrifuge and a sixth in-line NMR instrument disposed upstream of the centrifuge.

Embodiment 6: The apparatus as in any prior embodiment, wherein the in-line NMR instrument is disposed downstream of the cuttings processing system.

Embodiment 7: The apparatus as in any prior embodiment, wherein the cuttings processing system comprises a plurality of cuttings processing devices and the algorithm comprises instructions to sequentially control each cuttings processing device in a selected order.

Embodiment 8: The apparatus as in any prior embodiment, wherein cuttings processing device comprises a shale shaker, a vertical cuttings dryer, and a centrifuge.

Embodiment 9: The apparatus as in any prior embodiment, wherein the adjustable operational parameter comprises at least one of rotational speed, angle, conveyance speed, or screen size.

Embodiment 10: The apparatus as in any prior embodiment, further comprising at least one of a cuttings discharge control device coupled to the controller and configured to control conveyance of the cuttings or a cuttings discharge control device disposed in line with the in-line NMR instrument and coupled to the controller.

Embodiment 11: The apparatus as in any prior embodiment, wherein the NMR output signal is further related to an amount of water measured by the in-line NMR instrument.

Embodiment 12: A method for processing cuttings from drilling a borehole in a geologic formation, the method including processing the cuttings using a cuttings processing system configured to remove oil from the cuttings and comprising a cuttings processing device having an adjustable operational parameter related to operation of the cuttings processing device, measuring an amount of oil retained by the cuttings discharged by the cuttings processing system using an in-line nuclear magnetic resonance (NMR) instrument comprising a conduit coupled to an output of at least one of the cuttings processing system or the processing device and containing the discharged cuttings, the NMR instrument providing an NMR output signal related to the amount of oil measured by the in-line NMR instrument, and adjusting the adjustable operational parameter using a controller in accordance with an algorithm that uses the NMR output signal as input to reduce the amount of oil retained by the cuttings.

Embodiment 13: The method as in any prior embodiment, further measuring at least one of an amount of oil or an amount of water retained by the cuttings using another in-line NMR instrument disposed upstream and in-line with the cuttings processing system.

Embodiment 14: The method as in any prior embodiment, wherein adjusting the adjustable operational parameter comprises using at least one of an actuator or a device controller disposed on the cuttings processing device and coupled to the controller and wherein adjusting the adjustable operational parameter comprises implementing feedback control using the NMR output signal as a feedback signal to the controller.

Embodiment 15: The method as in any prior embodiment, wherein the cuttings processing device comprises a shaker and adjusting the adjustable operational parameter comprises adjusting a basket angle of the shaker.

Embodiment 16: The method as in any prior embodiment, wherein the cuttings processing device comprises a vertical dryer and adjusting the adjustable operational parameter comprises adjusting a speed of the vertical dryer.

Embodiment 17: The method as in any prior embodiment, wherein the cuttings processing device comprises a centrifuge and adjusting the adjustable operational parameter comprises adjusting a speed of the centrifuge.

Embodiment 18: The method as in any prior embodiment, wherein adjusting the adjustable operational parameter comprises adjusting a conveyance speed of cuttings being processed through the processing device.

Embodiment 19: The method as in any prior embodiment, further comprising at least one of stopping conveyance of the cuttings for processing or disposal after processing in response to the NMR output signal indicating that the amount of oil retained by the cuttings discharged by cuttings processing system exceeds a regulatory limit or sending the NMR output signal in real-time to a remote monitoring device.

Embodiment 20: The method as in any prior embodiment, further comprising measuring an amount of water retained by the cuttings discharged by the cuttings processing system using the in-line nuclear magnetic resonance (NMR) instrument, wherein the NMR output signal is further related to the amount of water measured by the in-line NMR instrument.

Elements of the embodiments have been introduced with either the articles "a" or "an." The articles are intended to mean that there are one or more of the elements. The terms "including" and "having" and the like are intended to be inclusive such that there may be additional elements other than the elements listed. The conjunction "or" when used with a list of at least two terms is intended to mean any term or combination of terms. The term "configured" relates to one or more structural limitations of a device that are required for the device to perform the function or operation for which the device is configured. The limitations may be known in the art for a specific item, but not known in the context of or application to the invention as a whole. The limitations may be inclusive of circuit modules and software known to perform a specific function. The term "coupled" relates to being coupled directly or indirectly using an intermediate device. The terms "first" and "second" and like are used to distinguish terms and not to denote a particular order.

The flow diagram depicted herein is just an example. There may be many variations to this diagram or the steps (or operations) described therein without departing from the scope of the invention. For example, operations may be performed in another order or other operations may be performed at certain points without changing the specific disclosed sequence of operations with respect to each other. All of these variations are considered a part of the claimed invention.

The disclosure illustratively disclosed herein may be practiced in the absence of any element which is not specifically disclosed herein.

While one or more embodiments have been shown and described, modifications and substitutions may be made thereto without departing from the scope of the invention. Accordingly, it is to be understood that the present invention has been described by way of illustrations and not limitation.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited.

What is claimed is:

1. An apparatus for removing oil from cuttings obtained from drilling a borehole in a geologic formation and that are no longer needed for drilling the borehole, the apparatus comprising:

a cuttings processing system comprising a cuttings processing device configured to remove oil from the cuttings, the cuttings processing device comprising an adjustable operational parameter related to operation of the cuttings processing device and at least one of an actuator or a device controller for adjusting the adjustable operational parameter;

an in-line nuclear magnetic resonance (NMR) instrument comprising a conduit coupled to an output of at least one of the cuttings processing system or the cuttings processing device and containing the obtained cuttings, the in-line NMVR instrument comprising an output providing an NMVR output signal related to an amount of oil measured by the in-line NMR instrument;

a controller coupled to the output of the in-line NMVR instrument, the controller having a controller output coupled to the cuttings processing device and providing a control signal to adjust the adjustable operational parameter in accordance with an algorithm that uses the NMVR output signal as input to reduce the amount of oil retained by the cuttings to provide processed cuttings with a reduced amount of retained oil; and a conduit or fitting that couples the cuttings processing system to a cuttings disposal apparatus for disposal of the processed cuttings with the reduced amount of retained oil.

2. The apparatus according to claim 1, wherein the cuttings in the conduit flow continuously through the conduit while being sensed by the in-line NMR instrument.

3. The apparatus according to claim 1, wherein the in-line NMR instrument further comprises a magnetic field source creating a static magnetic field within the conduit, an antenna transmitting a radio-frequency (RF) signal into the conduit and receiving an NMR signal in response to the transmitted signal, and electronics coupled to the antenna and having a processor processing the NMR signal to measure the amount of oil retained by the discharged cuttings, the electronics having an output providing the NMR output signal.

4. The apparatus according to claim 1, wherein the cuttings processing system comprises a plurality of cuttings processing devices and the in-line NMR instrument comprises a plurality of in-line NMR instruments with at least one of the in-line NMR instruments in the plurality being disposed immediately downstream of each of the cuttings processing devices and optionally another in-line NMR instrument in the plurality being disposed immediately upstream of each of the cuttings processing devices.

5. The apparatus according to claim 4, where the cuttings processing system comprises a shale shaker, a vertical cuttings dryer, and a centrifuge, and the in-line NMR instrument comprises: at least one of (i) a first in-line NMR instrument disposed immediately downstream of the shale shaker or (ii) a first in-line NMR instrument disposed immediately downstream of the shale shaker and a second in-line NMR instrument disposed upstream of the shale shaker; at least one of (iii) a third in-line NMR instrument disposed immediately downstream of the vertical cuttings dryer or (iv) a third in-line NMR instrument disposed immediately downstream of the vertical cuttings dryer and a fourth in-line NMR instrument disposed upstream of the vertical cuttings dryer; and at least one of (v) a fifth in-line NMR instrument disposed immediately downstream of the centrifuge or (vi) a fifth in-line NMR instrument disposed immediately downstream of the centrifuge and a sixth in-line NMR instrument disposed upstream of the centrifuge.

6. The apparatus according to claim 1, wherein the in-line NMR instrument is disposed downstream of the cuttings processing system.

7. The apparatus according to claim 6, wherein the cuttings processing system comprises a plurality of cuttings processing devices and the algorithm comprises instructions to sequentially control each cuttings processing device in a selected order.

8. The apparatus according to claim 7, wherein cuttings processing device comprises a shale shaker, a vertical cuttings dryer, and a centrifuge.

9. The apparatus according to claim 1, wherein the adjustable operational parameter comprises at least one of rotational speed, angle, conveyance speed, or screen size.

10. The apparatus according to claim 1, further comprising at least one of a cuttings discharge control device coupled to the controller and configured to control conveyance of the cuttings or a cuttings discharge control device disposed in line with the in-line NMR instrument and coupled to the controller.

11. The apparatus according to claim 1, wherein the NMR output signal is further related to an amount of water measured by the in-line NMR instrument.

12. The apparatus according to claim 1, further comprising a processed cuttings control device in communication with the controller and configured to isolate or control a flow rate of cuttings discharged by the cuttings processing system in response to the NMR output signal indicating that the amount of oil retained by the cuttings discharged by the cuttings processing system exceeds a threshold value.

13. A method for removing oil from cuttings obtained from drilling a borehole in a geologic formation and that are no longer needed for drilling the borehole, the method comprising:

processing the cuttings using a cuttings processing system configured to remove oil from the cuttings and comprising a cuttings processing device having an adjustable operational parameter related to operation of the cuttings processing device;

measuring an amount of oil retained by the cuttings discharged by the cuttings processing system using an in-line nuclear magnetic resonance (NMR) instrument comprising a conduit coupled to an output of at least one of the cuttings processing system or the cuttings processing device and containing the discharged cuttings, the in-line NMR instrument providing an NMR output signal related to the amount of oil measured by the in-line NMR instrument;

adjusting the adjustable operational parameter using a controller in accordance with an algorithm that uses the NMR output signal as input to reduce the amount of oil retained by the cuttings to provide processed cuttings with a reduced amount of retained oil; and discharging the processed cuttings with the reduced amount of retained oil to a cuttings disposal apparatus.

14. The method according to claim 13, further measuring at least one of an amount of oil or an amount of water retained by the cuttings using another in-line NMR instrument disposed upstream and in-line with the cuttings processing system.

15. The method according to claim 13, wherein adjusting the adjustable operational parameter comprises using at least one of an actuator or a device controller disposed on the cuttings processing device and coupled to the controller and wherein adjusting the adjustable operational parameter comprises implementing feedback control using the NMR output signal as a feedback signal to the controller.

16. The method according to claim 13, wherein the cuttings processing device comprises a shaker and adjusting the adjustable operational parameter comprises adjusting a basket angle of the shaker.

17. The method according to claim 13, wherein the cuttings processing device comprises a vertical dryer and adjusting the adjustable operational parameter comprises adjusting a speed of the vertical dryer.

18. The method according to claim 13, wherein the cuttings processing device comprises a centrifuge and adjusting the adjustable operational parameter comprises adjusting a speed of the centrifuge.

19. The method according to claim 13, wherein adjusting the adjustable operational parameter comprises adjusting a conveyance speed of cuttings being processed through the cuttings processing device.

20. The method according to claim 13, further comprising stopping conveyance of the cuttings for disposal after processing in response to the NMR output signal indicating that the amount of oil retained by the cuttings discharged by the cuttings processing system exceeds a regulatory limit.

21. The method according to claim 13, further comprising measuring an amount of water retained by the cuttings discharged by the cuttings processing system using the in-line nuclear magnetic resonance (NMR) instrument, wherein the NMR output signal is further related to the amount of water measured by the in-line NMR instrument.

22. The method according to claim 13, further comprising isolating or controlling a flow rate of cuttings discharged by the cuttings processing system using a processed cuttings control device in communication with the controller in response to the NMR output signal indicating that the amount of oil retained by the cuttings discharged by the cuttings processing system exceeds a threshold value.

* * * * *